United States Patent
Cho et al.

(10) Patent No.: US 8,432,159 B2
(45) Date of Patent: Apr. 30, 2013

(54) METHOD AND APPARATUS FOR MONITORING WALL THINNING OF A PIPE USING MAGNETOSTRICTIVE TRANSDUCERS AND VARIATION OF DISPERSION CHARACTERISTICS OF BROADBAND MULTIMODE SHEAR HORIZONTAL (SH) WAVES

(75) Inventors: Seung Hyun Cho, Daejeon (KR); Hyu Sang Kwon, Daejeon (KR); Bong Young Ahn, Daejeon (KR); Seung Seok Lee, Seoul (KR)

(73) Assignee: Korea Reseach Institute of Standards adn Scince, Daejeon (KR)

( * ) Notice: Subject to any disclaimer, the term of this patent is extended or adjusted under 35 U.S.C. 154(b) by 819 days.

(21) Appl. No.: 12/462,630

(22) Filed: Aug. 6, 2009

(65) Prior Publication Data
US 2010/0244591 A1    Sep. 30, 2010

(30) Foreign Application Priority Data
Mar. 30, 2009    (KR) ........................ 10-2009-0027102

(51) Int. Cl.
*G01R 33/18*    (2006.01)
*G01N 27/72*    (2006.01)

(52) U.S. Cl.
USPC .......................................... 324/209; 324/229

(58) Field of Classification Search .......... 324/228–231, 324/209; 73/637
See application file for complete search history.

(56) References Cited

U.S. PATENT DOCUMENTS 6,109,108 A * 8/2000 Ohtani et al. ................... 73/599
7,750,627 B2 * 7/2010 Sasaki et al. .................. 324/252

* cited by examiner

*Primary Examiner* — Bot Ledynh
(74) *Attorney, Agent, or Firm* — LRK Patent Law Firm

(57) ABSTRACT

Magnetostrictive transducers for monitoring wall thinning in a pipe, and an apparatus and method for monitoring wall thinning in a pipe using magnetostrictive transducers are provided. The magnetostrictive transducers generate broadband multimode shear horizontal (SH) waves, and allow the generated SH waves to travel along the pipe, thus correctly monitoring a status of the wall thinning of the pipe. The apparatus includes a transmitting transducer which is installed outside of a pipe and generates shear horizontal (SH) waves traveling along the pipe, a receiving transducer which is spaced apart from the transmitting transducer and measures the shear horizontal (SH) waves traveling along the pipe, and a controller for monitoring wall thinning of the pipe by exciting and measuring output signals of the transmitting and receiving transducers.

9 Claims, 12 Drawing Sheets

Lamb waves

SH waves

METHOD AND APPARATUS FOR MONITORING WALL THINNING OF A PIPE USING MAGNETOSTRICTIVE TRANSDUCERS AND VARIATION OF DISPERSION CHARACTERISTICS OF BROADBAND MULTIMODE SHEAR HORIZONTAL (SH) WAVES

BACKGROUND OF THE INVENTION

1. Field of the Invention

The present invention relates to magnetostrictive transducers for monitoring wall thinning of a pipe, and an apparatus and method for monitoring the wall thinning of a pipe using the magnetostrictive transducers, and more particularly to an apparatus and method for monitoring wall thinning of a pipe using magnetostrictive transducers and a variation in dispersion characteristics of broadband multimode SH waves, wherein the magnetostrictive transducers generate multimode high-frequency shear horizontal (SH) waves, and allow the generated SH waves to travel along the pipe, thus correctly monitoring a status of the wall thinning of the pipe.

2. Description of the Related Art

Typically, "wall thinning" refers to when a wall of a pipe becomes thinner due to corrosion and the like. In association with leakage of a fluid flowing in the pipe, the diagnosis and monitoring of wall thinning is considered to be very important in pipe management. Specifically, in the case where the leakage of such a fluid occurs in a pipe used in a Nuclear Power Plant, there may arise a serious accident, such that strict management and maintenance of the pipe is needed.

The above monitoring of the above wall thinning is one of critical technologies needed for guaranteeing safety of a pipe structure of the Nuclear Power Plant. In order to estimate wall thinning effectively, there is needed an improved technology for diagnosing the presence or absence of the wall thinning and continual monitoring the progress of the wall thinning.

One of promising methods for diagnosing the presence or absence of the wall thinning at high speed and continual monitoring the progress of the wall thinning is to use guided ultrasonic waves.

Guided ultrasonic waves can propagate over long distances, such that they have many advantages in conducting the above diagnosing/monitoring operations. As a result, many intensive researches have recently been conducted into the above method for diagnosing wall thinning of a pipe using guided ultrasonic waves.

However, in order to use guided ultrasonic waves to monitor wall thinning, a variety of problems need to be solved, for example, an appropriate transducer for monitoring should be developed, or the mode identification and the propagation of guided ultrasonic waves in the wall-thinning region should be understood.

Most frequently applied technique for using guided ultrasonic waves is to measure reflected waves from a defect or faulty part. However, this diagnosing method may be effectively used in a specific pipe having an abrupt change in thickness, but a reflection coefficient is not high in gradual thickness variation of a pipe wall, such that it is difficult to monitor the gradual wall thinning which may usually occurs in a pipe elbow due to flow accelerated corrosion (FAC) in Nuclear Power Plant.

SUMMARY OF THE INVENTION

Therefore, the present invention has been made in view of the above problems, and it is an object of the invention to provide an apparatus and method for monitoring wall thinning of a pipe using magnetostrictive transducers and a variation of dispersion characteristics of multimode SH waves, wherein the magnetostrictive transducers are used to detect a variation of dispersion characteristics of SH waves in order to diagnose gradual wall thinning of a pipe.

It is another object of the present invention to provide an apparatus and method for monitoring wall thinning of a pipe using magnetostrictive transducers and a variation of dispersion characteristics of broadband multimode SH waves, wherein the magnetostrictive transducers generate high-frequency multimode SH waves and the wall-thinning monitoring apparatus is implemented with the transducers. As a result, when multimode SH waves generated from the transducers pass over a gradual wall-thinning region, the above wall-thinning monitoring apparatus observes a variation of dispersion characteristics of modes, so that it is able to monitor the wall thinning.

In accordance with one aspect of the present invention, a magnetostrictive transducer includes a thin plate-shaped patch, two magnets for applying a bias magnetic field passing along the patch, and a coil arranged between the two magnets.

In accordance with another aspect of the present invention, an apparatus for monitoring wall thinning using magnetostrictive transducers and a variation of dispersion characteristics of broadband multimode shear horizontal (SH) waves includes a transmitting transducer which is installed outside of a pipe and generates shear horizontal (SH) waves traveling along the pipe, a receiving transducer which is spaced apart from the transmitting transducer and measures the shear horizontal (SH) waves traveling along the pipe, and a controller for monitoring wall thinning of the pipe by exciting and measuring signals of the transmitting and receiving transducers, wherein each of the transmitting and receiving transducers includes a thin plate-shaped patch, two magnets for applying a bias magnetic field passing along the patch, and a coil arranged between the two magnets.

BRIEF DESCRIPTION OF THE DRAWINGS

The patent or application file contains at least one drawing executed in color. Copies of this patent or patent application publication with color drawings will be provided by the Office upon request and payment of the necessary fee.

The above and other objects, features and other advantages of the present invention will be more clearly understood from the following detailed description taken in conjunction with the accompanying drawings, in which:

FIGS. 8 to 10 illustrate signals monitored by an apparatus for monitoring wall thinning using magnetostrictive transducers for use in embodiments of the present invention, wherein FIG. 8 illustrates a signal measured at a healthy plate, FIG. 9 illustrates a signal measured at a plate having wall thinning of 25%, and FIG. 10 illustrates a signal measured at a plate having wall thinning of 50%;

DETAILED DESCRIPTION OF THE INVENTION

Now, preferred embodiments of the present invention will be described in detail with reference to the annexed drawings.

Magnetostrictive transducers for monitoring wall thinning of a pipe, and an apparatus and method for monitoring the wall thinning using the magnetostrictive transducers according to embodiments of the present invention will be described in detail with reference to the annexed drawings.

Figure 1:
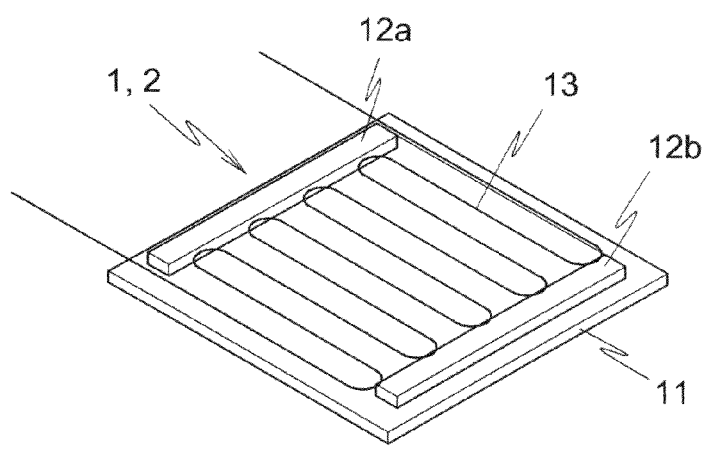
FIG. 1 is a perspective view illustrating an example of a magnetostrictive transducer according to the present invention.
Figure 2:
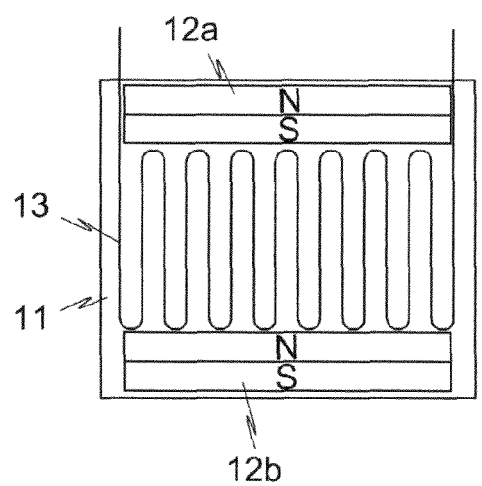
FIG. 2 is a plan view illustrating an example of a magnetostrictive transducer according to the present invention.
Figure 3:
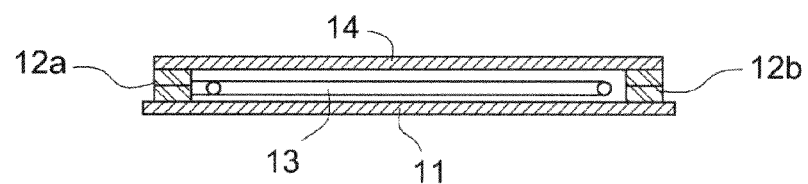
FIG. 3 is a plan view illustrating another example of a magnetostrictive transducer according to the present invention.
Figure 4:
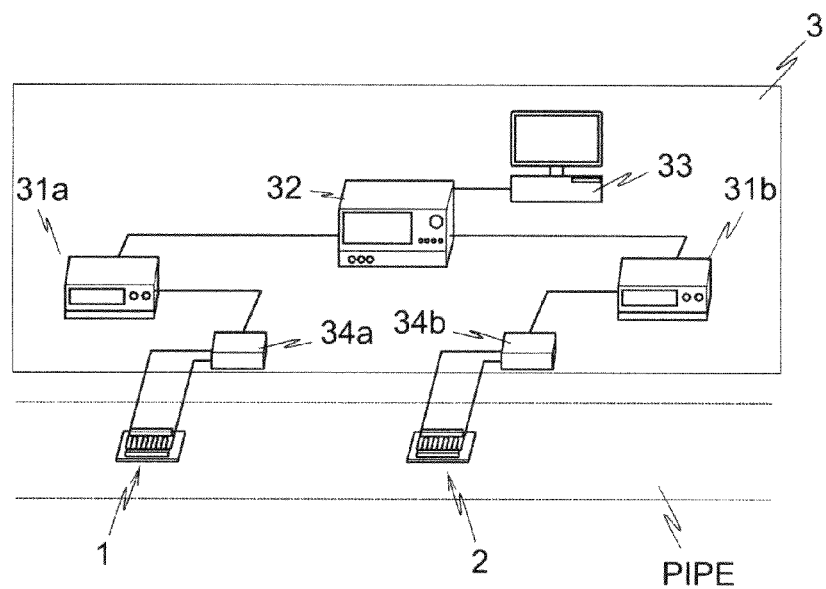
FIG. 4 is a schematic diagram illustrating an apparatus for monitoring wall thinning using magnetostrictive transducers.
Figure 5:
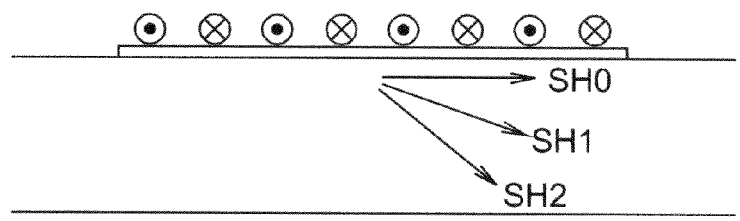
FIG. 5 illustrates a propagation of shear horizontal (SH) waves generated from magnetostrictive transducers.
Figure 6:
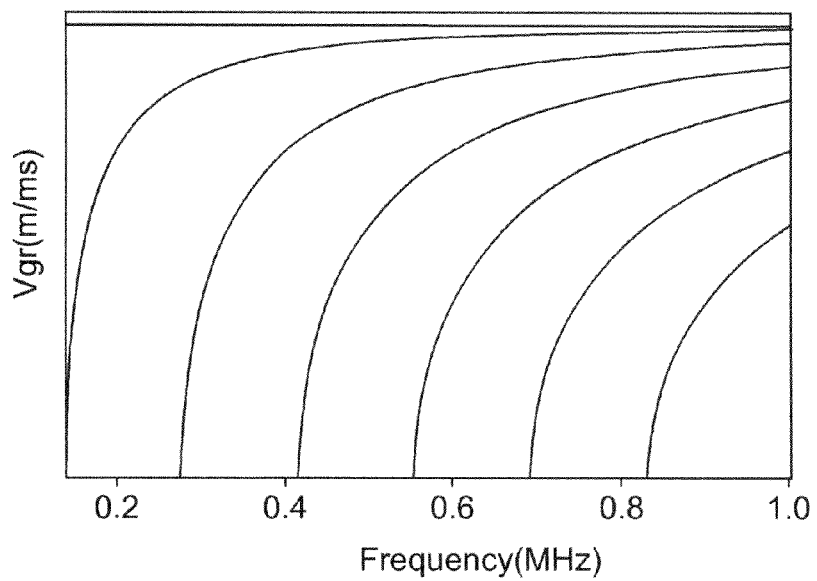
FIG. 6 illustrates the dispersion curves of a group velocity of SH waves generated from magnetostrictive transducers.
Figure 7:
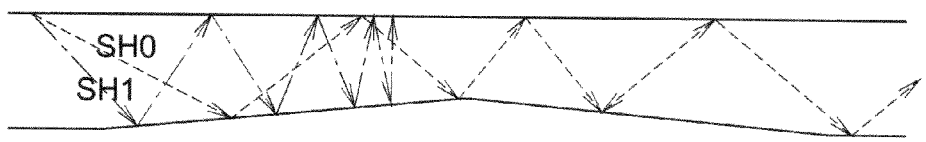
FIG. 7 illustrates a propagation of multiple modes of SH waves passing over a wall-thinning region.
Figure 8:
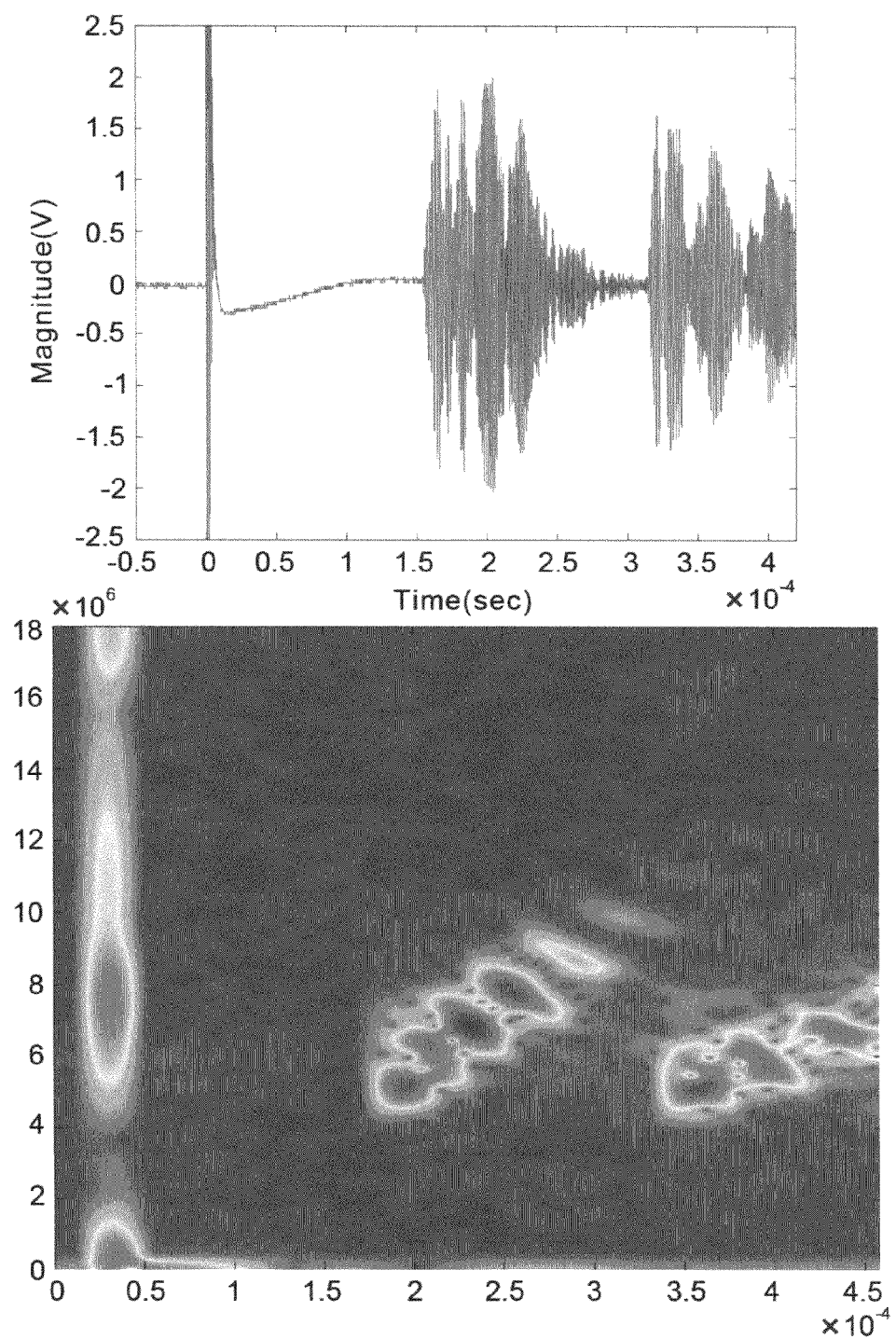
Figure 9:
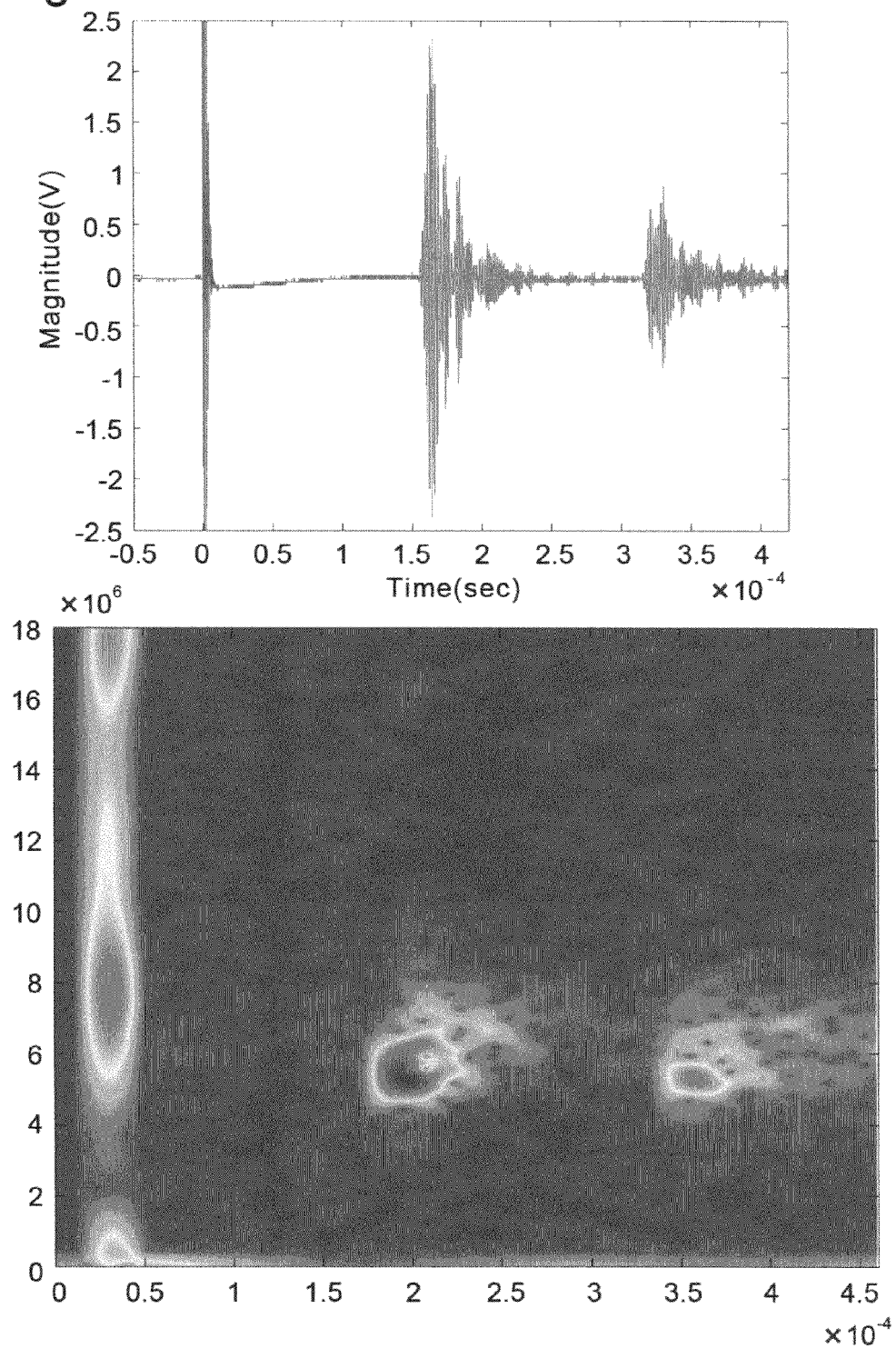
Figure 10:
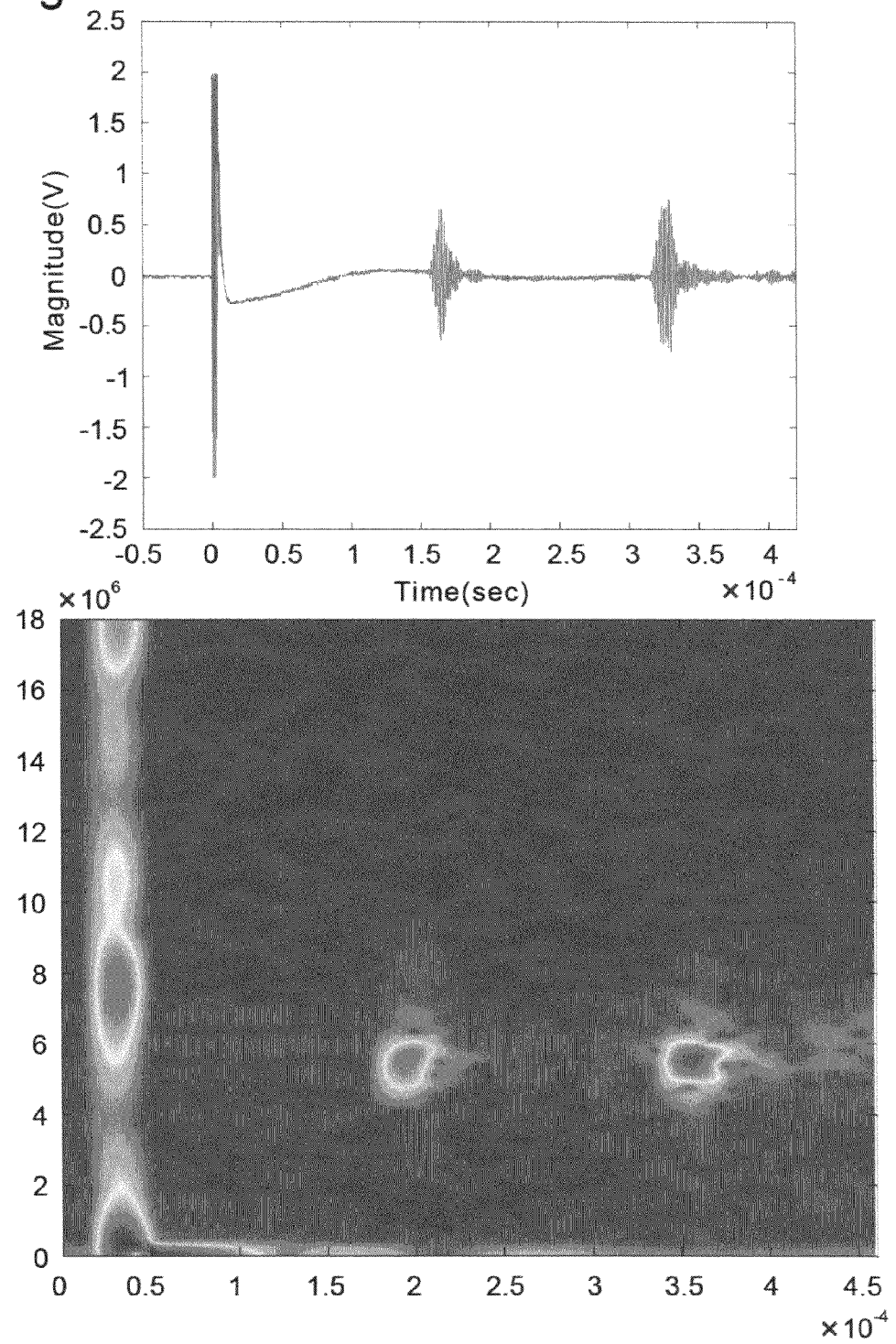

FIG. 1 is a perspective view illustrating an example of a magnetostrictive transducer according to the present invention. FIG. 2 is a plan view illustrating an example of a magnetostrictive transducer according to the present invention. FIG. 3 is a plan view illustrating another example of a magnetostrictive transducer according to the present invention. FIG. 4 is a schematic diagram illustrating an apparatus for monitoring wall thinning using magnetostrictive transducers. FIG. 5 illustrates a propagation of shear horizontal (SH) waves generated from magnetostrictive transducers. FIG. 6 illustrates curves illustrating dispersion of a group velocity of SH waves generated from magnetostrictive transducers. FIG. 7 illustrates a propagation of multiple modes of SH waves passing over a wall-thinning region. FIGS. 8 to 10 illustrate signals monitored by an apparatus for monitoring wall thinning using magnetostrictive transducers for use in embodiments of the present invention. FIG. 8 illustrates a signal measured at a healthy plate. FIG. 9 illustrates a signal measured at a plate having wall thinning of 25%. FIG. 10 illustrates a signal measured at a plate having wall thinning of 50%.

As shown in FIG. 1, a magnetostrictive transducer for monitoring wall thinning of a pipe according to an embodiment of the present invention includes a thin plate-shaped patch 11, two magnets 12a and 12b for applying a bias magnetic field passing along the patch 11, and a coil 13 arranged between the magnets 12a and 12b.

The patch 11 is shaped in the form of a thin plate, which is made of a ferromagnetic material exhibiting strong magnetostriction or an alloy thereof. A transmitting transducer is modified in shape by a magnetic field generated by the coil and the magnets, such that it generates SH waves. A receiving transducer measures the SH waves propagated from the transmitting transducer. The patch 11 is made of a flexible thin plate, and may be installed according to the shape of a pipe.

The patch 11 may be made of an iron-cobalt alloy having very high resistance to heat, such that it maintains magnetostriction even at high temperature so as to be suitable for a high-temperatured pipe such as a pipe used in a Nuclear Power Plant.

The patch 11 deforms under the condition that it is coupled with the pipe, so that elastic waves are generated in the pipe and are propagated along the pipe.

The coil 13 and the magnets 12a and 12b are used to generate SH waves by interaction therebetween. As can be seen from FIG. 1, the coil 13 is arranged in the form of a meander, and the magnets 12a and 12b are installed at both sides of the meander-structured coil 13 (hereinafter referred to as "meander coil 13"), respectively.

In other words, the coil 13 is arranged as a meander structure between the magnets 12a and 12b, and the wavelength of SH waves generated by the transducer can be controlled by adjusting a line interval of the meander coil 13.

The magnets 12a and 12b are used to apply a bias magnetic field, and each may be either a permanent magnet or an electromagnet. The magnets 12a and 12b are arranged to enable the applied magnetic field to pass along the patch 11.

The bias magnetic field is perpendicular to a dynamic magnetic field generated by the coil, and causes shear deformation in the patch 11, such that it generates SH waves. Instead of using the permanent magnet or the electromagnet to apply the bias magnetic field, a premagnetization process which uses remanent magnetization kept in the patch 11 after pre-rubbing the permanent magnet may also be used.

As shown in FIG. 2, in order to apply the bias magnetic field with permanent magnets 12a and 12b passing along the patch 11, the N pole of the magnet 12a faces the meander coil 13 while the S pole of the magnet 12b does.

A yoke 14 may be used to improve the efficiency for applying the bias magnetic field generated by the magnets 12a and 12b along the patch 11.

In more detail, as shown in FIG. 3, the magnets 12a and 12b are connected to each other by the yoke 14 so as to decrease a leakage magnetic flux, thus increasing the applied magnetic-field intensity.

As shown in FIG. 3, an apparatus for monitoring wall thinning using such magnetostrictive transducers includes a transmitting transducer 1 which is installed outside of a pipe and generates SH waves traveling along the pipe, a receiving transducer 2 which is spaced apart from the transmitting transducer 1 and measures the SH waves traveling along the pipe, and a controller 3 for monitoring wall thinning of the pipe by exciting and measuring signals of the transmitting and receiving transducers 1 and 2.

The transmitting or receiving transducer 1 or 2 may be the above-mentioned magnetostrictive transducer for monitoring the wall thinning. The transmitting transducer 1 may be used to propagate the SH waves along the pipe after receiving a current signal. The receiving transducer 2 may be used to measure the SH waves propagated along the pipe.

Operations of the transmitting and receiving transducers are as follows.

The static bias magnetic field induced by the magnets 12a and 12b of the transmitting transducer 1 and the dynamic magnetic field induced by the current flowing in the coil 13 are simultaneously applied in the patch 11.

If the excitation current flows in the coil 13, an excitation magnetic field perpendicular to the bias magnetic field is applied to the patch 11 made of a ferromagnetic material. Therefore, shear deformation of the patch 11 occurs by the magnetostrictive effect. This shear deformation of the patch 11 is transferred to the pipe, such that SH waves are generated in the pipe and propagated.

If the SH waves are propagated along the pipe, the patch 11 of the receiving transducer 2 exhibits shear deformation, and a magnetic field is induced near the patch 11 due to the inverse magnetostrictive effect. The variation of the magnetic field induces electromotive force in the coil 13 of the receiving transducer 2, an amount of the voltage by the induced electromotive force is measured, the controller 3 monitors the measured voltage output signal, and thus the presence or absence of the wall thinning is determined by a signal processing of the measured signal.

As shown in FIG. 3, the magnets 12a and 12b are arranged perpendicular to an axial direction of the pipe, and the coil is arranged in the form of a meander structure perpendicular to the axis of the pipe between the magnets 12a and 12b, such that the SH waves generated from the transmitting transducer 1 may be directed lengthwise along the pipe.

As shown in FIG. 4, the controller 3 includes a pulser 31a for applying a high-power pulse signal to the transmitting transducer 1, a receiver 31b for amplifying a signal received from the receiving transducer 2, an oscilloscope 32 for displaying a measured signal changing with time, and a computer 33 for calculating the degree of wall thinning by analyzing a measured signal displayed in the oscilloscope 32.

The use of the pulser 31a, the receiver 31b, the oscilloscope 32, and the computer 33 is well known to those skilled in the art, and as such a detailed description thereof will be omitted herein for convenience of description.

In FIG. 4, each of reference numbers 34a and 34b represents an amplifier.

A method for monitoring wall thinning using the above apparatus for monitoring the wall thinning using the aforementioned magnetostrictive transducers will hereinafter be described in detail.

The wall-thinning monitoring apparatus according to the present invention may use a variation of dispersion characteristics of SH waves so as to diagnose gradual wall thinning.

In this case, the term "dispersion" denotes that the shape of traveling waves is distorted due to a difference in wave velocity of each frequency component.

Generally, as shown in FIG. 5, dispersion characteristics of SH waves flowing along the pipe are well known to those skilled in the art, but the dispersion characteristics are changed when there exists a faulty condition such as wall thinning. The changed dispersion characteristics are measured, such that the presence or absence of such wall thinning or the degree of the wall thinning may be determined.

If several modes of SH waves are simultaneously propagated to diagnose and monitor the gradual wall thinning, a higher-order mode may disappear earlier when the SH waves pass over a region of the gradual wall thinning. The wall-thinning monitoring apparatus according to the present invention has been developed using the above-mentioned disappearance of the high-order mode.

The reason why the transducer and the wall-thinning diagnosing apparatus according to the present invention use SH waves is as follows.

Figure 11:
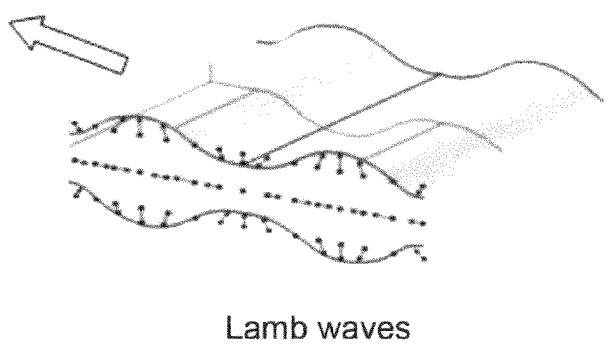
FIG. 11 illustrates a propagation of Lamb waves in a plate.
Figure 12:
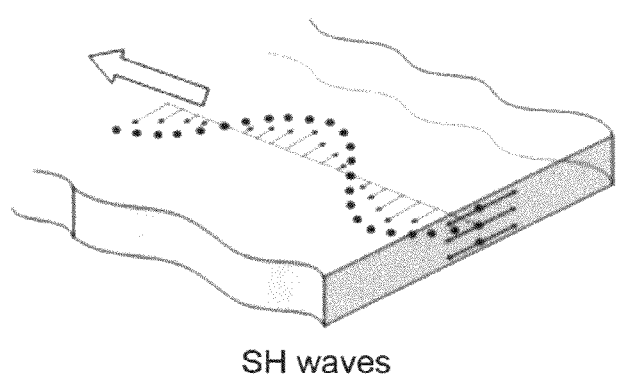
FIG. 12 illustrates a propagation of SH waves in a plate.

Guided ultrasonic waves, which exist in a plate-like structure, are classified into Lamb waves and SH waves according to displacement direction of particles. FIG. 11 illustrates a propagation of Lamb waves in a plate. As shown in FIG. 11, if guided ultrasonic waves are generated when particles vibrate in a plane arranged in the direction of a thickness of the plate, the guided ultrasonic waves are Lamb waves. FIG. 12 illustrates a propagation of SH waves in a plate. As shown in FIG. 12, if guided ultrasonic waves are generated when particles vibrate perpendicular to wave-propagating direction in a horizontal plane of the plate, the guided ultrasonic waves are SH waves.

In case of a fundamental mode among various modes of the SH waves, this wave travels without being affected by an upper or lower boundary of the plate, such that they are non-dispersive. In addition, since a displacement of SH waves at the upper or lower surface of the plate occurs in a horizontal plane, the SH waves are usually affected less by any neighboring medium, so that the SH waves have less attenuation and may be propagated even to long distances. Most of all, the SH waves have dispersion characteristics by which modes do not cross each other, such that each mode can be analyzed easier and the dispersion characteristics can also be easily identified.

Each mode of the SH waves has unique dispersion characteristics according to structural properties and geometry of the plate. If a geometrical shape of the plate is changed due to a faulty condition such as wall thinning, the dispersion characteristics of each mode may also be changed. In case of the gradual wall thinning, higher-order modes of the SH waves do not pass easier over the wall-thinning part, such that the higher-order modes may disappear.

In detail, if the wall thinning occurs in the pipe while SH waves of multiple modes (i.e., a multimode) are propagated along the pipe, a variation of dispersion characteristics such as disappearance of high-order mode arises, and this variation of dispersion characteristics can be easily measured. Accordingly, the SH waves are used in the present invention.

EXPERIMENTAL EXAMPLE

In order to conduct an experiment to verify the apparatus of the present invention, SH waves of 500 kHz~1 MHz were generated and measured in a healthy plate and a wall-thinned plate in such a way that the variation of dispersion characteristics was observed as follows.

In order to effectively generate and measure the SH waves, the transducer for use in the present invention is configured as described above.

The transducer according to the present invention is used to generate and measure SH waves. The patch 11 is made of an iron-cobalt alloy, the coil 13 is shaped in the form of a meander in which neighboring lines are spaced apart from each other by 3 mm. A neodymium magnet is used as each of the permanent magnets 12a and 12b.

The SH waves generated from the transducers 1 and 2 are propagated in the length direction of the plate used as a medium as shown in FIG. 4. Referring to the dispersion curves of a group velocity in FIG. 5, a fundamental mode SH0 shows non-dispersive waves, the wave speed is always constant in all frequency bands and is not affected by the size of a plate.

In addition, since the fundamental mode (SH0) has the fastest group velocity in a total frequency band, each mode can be easily discriminated when a measured signal is analyzed, such that the fundamental mode (SH0) may be used as a reference for analyzing other modes. As can be seen from the above dispersion curves, SH waves do not cross each other, such that mode disappearance can be easily used for the SH waves.

FIG. 7 illustrates SH waves propagating in a medium.

A carbon steel plate having a thickness of 11.75 mm was used as a test specimen for the wall-thinning monitoring apparatus including the above-mentioned transducers.

The specimen may be a healthy plate, a 25% wall-thinned plate having a maximum wall-thinning depth corresponding to ¼ of its thickness, or a 50% wall-thinned plate having a maximum wall-thinning depth corresponding to ½ of its thickness. The shape of the cross section of the wall thinning is parabolic, and a single square wave of 500 kHz is used as an excitation signal.

FIG. 8 shows a signal measured at a healthy plate. As can be seen from FIG. 8, a signal measured in a time domain is widely spread over in time domain although one excitation pulse is used. From the viewpoint of a time-frequency analysis, it can be easily recognized that the measured signal in time domain spreads out because wave modes with different velocities are overlapped with each other due to the dispersion of each wave mode.

Energy of the measurement signal is focused on a band of about 500 kHz~1 MHz. A center frequency is increased in proportion to the order of a mode, because a transducer based on a meander coil very strongly restricts a band of a wavelength.

As described above, the identification of a mode can be easily achieved in SH waves. The arrival of modes is sequentially carried out in the SH waves, such that modes can be distinguished from each other more easily with dispersion curves of the test plate.

In other words, as can be seen from a spectrogram of FIG. 8, modes up to "SH7" having a center frequency of about 1.2 MHz can be easily confirmed. Since modes SH0~SH3 have similar velocities, there is little difference in arrival times of modes, such that it is difficult to discriminate among the modes SH0~SH3. If a lower frequency pulse is excited in which a difference in wave velocity among the generated modes is increased, the modes SH0~SH3 can be more easily distinguished from each other.

FIGS. 9 and 10 illustrate signals measured at wall-thinned plates, respectively. FIG. 9 illustrates a plate having wall thinning of 25%, and FIG. 10 illustrates a plate having wall thinning of 50%.

As can be seen from FIG. 9, in the 25% wall-thinned plate, the magnitude of a low-order mode is almost equal to that of the healthy plate, whereas high-order modes disappear, such that it can be recognized that the variation of dispersion characteristics arises.

In this case, signals of modes up to SH4 are measured although they are indistinct. In the 50% wall-thinned plate, a signal region is considerably reduced in a time domain due to the disappearance of high-order modes. In addition, the mode SH4, which has been observed on the 25% wall-thinned plate, is hardly measured on the 50% wall-thinned plate.

As described above, it can be easily recognized that the variation of dispersion characteristics in SH waves occurs in the gradual wall-thinning, and high-order modes disappear by such gradual wall thinning in such a way that the wall thinning of a pipe can be monitored.

According to the apparatus and method for monitoring wall thinning using the magnetostrictive transducers, the transmitting transducer generates multimode SH waves such that the SH waves are propagated in the axial direction of a pipe, and the receiving transducer monitors the variation of dispersion characteristics of the measured SH-wave modes by monitoring the SH waves propagated along the pipe, such that the presence or absence of the wall thinning can be determined.

As apparent from the above description, the present invention provides transducers for monitoring wall thinning capable of exciting multimode SH waves, thus more correctly monitoring the wall thinning.

In other words, the present invention provides transducers for generating high-frequency multimode SH waves, and implements the wall-thinning monitoring apparatus using the transducers. When the multimode SH waves pass over a wall-thinning region while being propagated, the apparatus or method of the present invention observes the variation of dispersion characteristics of modes, such that wall thinning of a pipe can be more effectively monitored.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A magnetostrictive transducer comprising:
   a thin plate-shaped patch;
   two magnets for applying a bias magnetic field passing along the patch; and
   a coil arranged between the two magnets,
   wherein the coil is arranged in the form of a meander structure,
   wherein the patch is made of a ferromagnetic material exhibiting strong magnetostriction or an alloy thereof,
   wherein each of the magnets corresponds to any of a permanent magnet, an electromagnet, or a premagnetization process, and
   wherein the magnets are arranged to allow the magnetic field to pass along the patch in a direction perpendicular to an axis of a pipe.

2. The magnetostrictive transducer according to claim 1, wherein the magnets decrease a leakage magnetic flux by installing a yoke for the improvement of the efficiency to increase the applied magnetic field intensity along a patch.

3. An apparatus for monitoring wall thinning using magnetostrictive transducers and a variation of dispersion characteristics of broadband multimode shear horizontal (SH) waves, the apparatus comprising:
   a transmitting transducer which is installed outside of a pipe and generates shear horizontal (SH) waves traveling along the pipe;
   a receiving transducer which is spaced apart from the transmitting transducer and measures the shear horizontal (SH) waves traveling along the pipe; and
   a controller for monitoring wall thinning of the pipe by exciting and measuring signals of the transmitting and receiving transducers,
   wherein each of the transmitting and receiving transducers includes a thin plate-shaped patch, two magnets for applying a bias magnetic field passing along the patch, and a coil arranged between the two magnets.

4. The apparatus according to claim 3, wherein the coil is arranged in the form of a meander, and the patch is made of an iron-cobalt alloy.

5. The apparatus according to claim 3, wherein each of the magnets is either a permanent magnet or an electromagnet, and the magnets are arranged to allow the magnetic field to easily flow along the patch.

6. The apparatus according to claim 4, wherein each of the magnets is either a permanent magnet or an electromagnet, and the magnets are arranged to allow the magnetic field to easily flow along the patch.

7. The apparatus according to claim 5, wherein the magnets are arranged to allow the magnetic field to be generated in a direction perpendicular to a pipe axis, and the coil is arranged in the form of a meander structure perpendicular to the pipe between the magnets.

8. The apparatus according to claim 6, wherein the magnets are arranged to allow the magnetic field to be generated in a direction perpendicular to a pipe axis, and the coil is arranged in the form of a meander structure perpendicular to the pipe between the magnets.

9. A method for monitoring wall thinning using magnetostrictive transducers and a variation of dispersion characteristics of broadband multimode shear horizontal (SH) waves in a wall-thinning monitoring apparatus, which includes a transmitting transducer which is installed outside of a pipe and generates shear horizontal (SH) waves traveling along the pipe, a receiving transducer which is spaced apart from the transmitting transducer and measures shear horizontal (SH) waves traveling along the pipe, and a controller for monitoring wall thinning of the pipe by exciting and measuring signals of the transmitting and receiving transducers, wherein each of the transmitting and receiving transducers includes a thin plate-shaped patch, two magnets for applying a bias magnetic field passing along the patch, and a coil arranged between the two magnets, the method comprising:

generating, by the transmitting transducer, multimode SH waves, and propagating the SH waves in a direction of a pipe axis; and receiving, by the receiving transducer, the SH waves propagated along the pipe, and monitoring whether a variation of mode's dispersion characteristics occurs in the measured SH waves.

* * * * *